United States Patent [19]

Liu

[11] 4,383,869
[45] May 17, 1983

[54] METHOD FOR ENHANCING ELECTRON MOBILITY IN GAAS

[75] Inventor: Shing-Gong Liu, Princeton, N.J.

[73] Assignee: RCA Corporation, New York, N.Y.

[21] Appl. No.: 273,303

[22] Filed: Jun. 15, 1981

[51] Int. Cl.³ ............................................ H01L 21/265
[52] U.S. Cl. .................................... 148/1.5; 148/187; 357/61; 357/63; 357/91
[58] Field of Search ................... 148/1.5, 187; 357/61, 357/63, 91

[56] References Cited

U.S. PATENT DOCUMENTS 3,925,106 12/1975 Ku ....................................... 148/1.5

OTHER PUBLICATIONS

Donnelly et al., Solid State Electronics, 20 (1977) 273.
Yeo et al., J. Appl. Phys. 51 (1980) 5785.
Rao et al., J. Appl. Phys. 49 (1978) 3898.
Stoneham et al., J. Electronic Materials, 9 (1980) 371.
Pedrotti et al., J. Appl. Phys. 51 (1980) 5781.
Stolte in Ion Implantation in S/C, 1976 ed. Chernow et al., Plenum, N.Y. pp. 1 and 9.
Favennec et al., Solid St. Electronics, 21 (1978) 705.
Ion Implantation of Sulfur and Silicon in GaAs, S. G. Liu et al., RCA Review, vol. 41, 1980, pp. 227–262.

*Primary Examiner*—Upendra Roy
*Attorney, Agent, or Firm*—Birgit E. Morris; Donald S. Cohen; Kenneth R. Glick

[57] ABSTRACT

The electron mobility in an active layer on a semi-insulating substrate is enhanced by initially performing a high energy implantation of an element which is inert in the semi-insulating material. Donor ions are then implanted so as to form the active layer in that area of the substrate in which the high energy implantation was performed, and the substrate is annealed.

12 Claims, 1 Drawing Figure

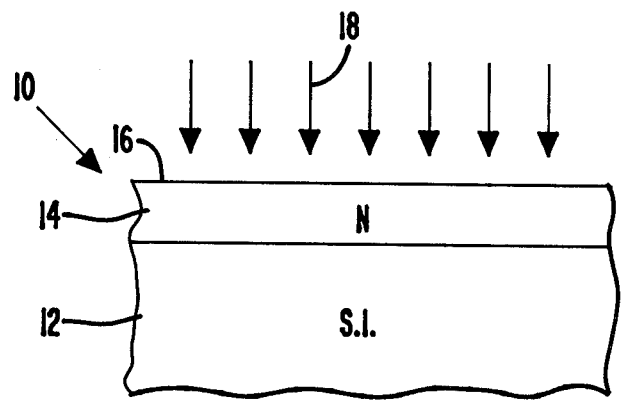

METHOD FOR ENHANCING ELECTRON MOBILITY IN GAAS

The U.S. Government has rights in this invention pursuant to Contract No. N00014-78-C-0367 awarded by the Department of the Navy.

BACKGROUND OF THE INVENTION

The present invention relates to a method for enhancing the electrical properties of compound semiconductor materials. More particularly, the invention relates to a method for enhancing electron mobility in N type III-V semiconductor materials.

Binary, ternary, and quaternary compound semiconductor materials are frequently used in electronic devices which are to be operated at high frequencies. For example, binary III-V compounds such as GaAs, InP, and InAs are commonly used in the fabrication of microwave FETs and devices for gigabit-rate logic applications. Compound semiconductor materials are used because they intrinsically provide greater electron mobility than silicon or germanium materials.

In the fabrication of a compound semiconductor device one typically starts with a semi-insulating substrate and then provides an active layer on a surface of the substrate. Conventional techniques for forming the active layer include epitaxial growth and ion implantation. For example, to create an N type active layer, electron donor impurities are introduced during either the epitaxial growth or the ion implantation. In a III-V material such as GaAs, N type dopants include sulfur and silicon, and an active layer can be formed as described in ION IMPLANTATION OF SULFUR AND SILICON IN GaAs, S. G. Liu et al., RCA Review, Vol. 41, 1980, pp. 227-262.

In the present invention a method for enhancing the electron mobility of N type GaAs is disclosed. However, it should be recognized that although the invention is described in terms of experimentation with GaAs, it is expected that other III-V materials, as well as ternary and quaternary materials, will behave in a similar manner.

SUMMARY OF THE INVENTION

A method for enhancing the electron mobility in GaAs comprises the steps of implanting an inert dopant into a semi-insulating substrate, implanting donor ions into the substrate, and then annealing the substrate.

BRIEF DESCRIPTION OF THE DRAWING

The FIGURE illustrates a semi-insulating substrate in which the implantations of the present invention have been performed.

DETAILED DESCRIPTION

A sectional view of a substrate of the present invention is illustrated at 10 in the FIGURE. The substrate 10 is comprised of a semi-insulating wafer 12 having an active layer 14 disposed thereon. The substrate 10 is a generalized structure and represents a starting point for the fabrication of a variety of semiconductor devices. For example, a depletion type field effect transistor can readily be fabricated on the substrate 10 by forming, in seriatim, spaced source, gate, and drain electrodes on the surface 16 of the active layer; the source and drain electrodes being in ohmic contact with the active layer and the gate electrode forming a Schottky barrier contact with the active layer.

In the preferred embodiment the wafer 12 is single crystalline GaAs, and it might be doped with chromium or oxygen so as to insure its semi-insulating nature. Such doping compensates for N or P type background impurities which, for example, might have been introduced during wafer fabrication. Commercially available semi-insulating GaAs wafers typically are chromium doped in concentrations ranging from approximately $5 \times 10^{16} - 10^{17} \text{cm}^{-3}$ and have resistivities of approximately $10^7$ to $10^8 \Omega$-cm.

In the process of the present invention, a surface portion of the semi-insulating wafer 12 is transformed into a high mobility N type active layer by means of exposure to an ion implantation sequence shown at 18 in the FIGURE. In the indicated S. G. Liu et al. article, there is described a method for fabricating an N type layer in semi-insulating GaAs by ion implanting $^{28}$Si and $^{32}$S therein. Since both silicon and sulfur act as donor atoms in GaAs, an N type layer results in the implanted portion of the GaAs wafer. Alternatively, selenium can be used as an N type dopant.

When fabricating a device such as FET, it is desirable to create an active layer 14 having high electron mobility $\mu$. Additionally, it is desirable to have high activation efficiency $\eta$ when generating the layer by implantation; $\eta$ being defined as sheet carrier concentration $N_S$ divided by implantation fluence $N'_S$. Elaborated herein is a technique for enhancing both the mobility and the activation efficiency of an implanted active layer by performing a high energy implantation of an inert atomic species such as argon or phosphorus prior to the donor-ion implantation, and then annealing the substrate.

The term high energy, used in reference to the initial implantation, means an energy level greater than the subsequent donor-ion implantation energy level. There is no requirement as to minimum high energy implantation value, although 100 KeV might be considered a potential lower limit and 300-400 KeV might be a convenient preferred range. Controlled experimentation comparing the effect of a high energy (750 KeV) argon implantation on a subsequent Si implantation was performed, and the results are tabulated below. These results are presented to further illustrate the present invention, and are not intended to limit the scope of the invention further than is stated in the subjoined claims.

| WAFER | Ar IMPLANTATION ENERGY (KeV) | Ar IMPLANTATION DOSE (cm$^{-2}$) | Si IMPLANTATION ENERGY (KeV) | Si IMPLANTATION DOSE (cm$^{-2}$) | $N_S$ (cm$^{-2}$) | $\mu$ (cm$^2$/V-s) | $\eta$ (%) |
|---|---|---|---|---|---|---|---|
| A | NONE | NONE | 200 | $2 \times 10^{12}$ | $3.4 \times 10^{11}$ | 1650 | 34.1 |
| B | 750 | $5 \times 10^{12}$ | 200 | $2 \times 10^{12}$ | $1.4 \times 10^{12}$ | 4410 | 67.4 |
| C | 750 | $1 \times 10^{13}$ | 200 | $2 \times 10^{12}$ | $1.6 \times 10^{12}$ | 4320 | 78.0 |
| D | NONE | NONE | 180 | $5.2 \times 10^{12}$ | $4.0 \times 10^{12}$ | 3100 | 60.5 |
|   |      |      | 50  | $1.4 \times 10^{12}$ |                      |      |      |
| E | 750 | $5 \times 10^{12}$ | 180 | $5.2 \times 10^{12}$ | $4.7 \times 10^{12}$ | 4280 | 71.2 |

| WAFER | Ar IMPLANTATION | | Si IMPLANTATION | | $N_S$ (cm$^{-2}$) | $\mu$ (cm$^2$/V-s) | $\eta$ (%) |
|---|---|---|---|---|---|---|---|
| | ENERGY (KeV) | DOSE (cm$^{-2}$) | ENERGY (KeV) | DOSE (cm$^{-2}$) | | | |
| | | | 50 | $1.4 \times 10^{12}$ | | | |

-continued

Wafers A, B, and C indicate the effect of argon implantation on a subsequent low implantation dose of silicon, and wafers D and E show the effect of argon implantation on a subsequent medium dose silicon implantation. The low implantation silicon dose was performed in a single step, whereas the medium implant silicon dose was performed in two steps. The two step silicon implantation was chosen so as to approximate a donor ion concentration profile in an epitaxially grown layer, there is no limitation or preference for the donor-ion implantation to be a two step process. Following the implantations, all wafers were annealed at 825° C. for 20 minutes under arsenic overpressure, so as to reduce any crystalline damage which occurred during the implantation steps.

As the data indicates, all argon implanted wafers exhibited significantly greater electron mobilities and activation efficiencies than the corresponding non-implanted control wafers. Furthermore, similar results have been demonstrated by implanting phosphorus at 900 KeV and $1 \times 10^{13}$cm$^{-2}$, and it is expected that other inert atomic species would also be effective. Generally, the high energy implant fluence range should be approximately $1 \times 10^{12}$cm$^{-2}$ to $5 \times 10^{13}$cm$^{-2}$, although the preferred range, when implanting in GaAs, is $5 \times 10^{12}$cm$^{-2}$ to $1 \times 10^{13}$cm$^{-2}$.

In the tabulated results all wafers were annealed in a single step following the silicon implantation. Alternatively, the annealing can be performed in two steps, first after the high energy implant and then again, after the donor-ion implant. When annealing thermally, the preferred conditions are approximately 800°-900° C. for 15-30 minutes. Alternatively, the annealing can be performed by exposure to appropriate laser radiation.

The significance of the argon implantation is that it improves the low implant dose threshold for a subsequent donor ion implantation in chromium doped semi-insulating GaAs substrates. The improvement is believed to occur because the argon implantation and subsequent annealing causes a chromium concentration redistribution at the surface 16 of the substrate 10. Chromium distribution profiles were measured in all indicated wafers by secondary ion mass spectrometry (SIMS), and a redistribution of chromium was observed to depths of up to 1.6 microns. Chromium depletion was observed to depths of up to approximately 0.5 microns, and the depletion was substantially uniform throughout the 0.5 micron thickness. The chromium concentration in the non-implanted portions of the wafer 12 was approximately $5 \times 10^{16}$-$10^{17}$cm$^{-3}$ whereas the chromium concentration in the chromium-depleted layer was approximately $1 \times 10^{16}$cm$^{-3}$.

The process of the present invention thus provides a method for fabricating a high quality N type layer on a semi-insulating substrate. The high electron mobilities induced are particularly suitable for use in devices which are to be operated at high frequencies, such as in the microwave range. Furthermore, as previously indicated, although the invention has been described in terms of argon implantation into gallium arsenide, experimentation indicates applicability to other substrate materials and other species of high energy implanted ions.

What is claimed is:

1. A method for enhancing electron mobility in a semi-insulating substrate, comprising:
    implanting into said substrate high energy ions of a material which is inert in said substrate so as to form a surface layer in said substrate;
    implanting donor ions into said surface layer; and
    annealing said substrate.

2. A method in accordance with claim 1, wherein the substrate is a III-V material.

3. A method in accordance with claim 2, wherein the substrate is GaAs.

4. A method in accordance with claim 3, wherein the substrate is doped with a compensating impurity.

5. A method in accordance with claim 4, wherein the compensating impurity is an element selected from the group consisting of chromium and oxygen.

6. A method in accordance with claim 1, wherein the donor ion is an element selected from the group consisting of silicon, sulfur, and selenium.

7. A method in accordance with claim 1, wherein the high energy ions consist of an element selected from the group consisting of argon and phosphorus.

8. A method in accordance with claim 7, wherein argon is implanted at 750 KeV and a fluence of approximately $5 \times 10^{12}$cm$^{-2}$ to $1 \times 10^{13}$cm$^{-2}$.

9. A method in accordance with claim 1, further comprising:
    annealing the substrate after the high energy ion implantation.

10. A method in accordance with claim 1 or 9, comprising annealing at approximately 800°-900° C. for approximately 15-30 minutes.

11. A method in accordance with claim 1, wherein the high energy ions are implanted at an energy greater than approximately 100 KeV.

12. A method in accordance with claim 1, wherein the high energy ions are implanted at a fluence between approximately $1 \times 10^{12}$cm$^{-2}$ and $5 \times 10^{13}$cm$^{-2}$.

* * * * *

UNITED STATES PATENT AND TRADEMARK OFFICE
CERTIFICATE OF CORRECTION

PATENT NO. : 4,383,869

DATED : May 17, 1983

INVENTOR(S) : Shing-Gong Liu

It is certified that error appears in the above-identified patent and that said Letters Patent is hereby corrected as shown below:

The table divided between columns 2 and 3 should appear as follows:

| WAFER | Ar IMPLANTATION ENERGY (KeV) | Ar IMPLANTATION DOSE (cm$^{-2}$) | Si IMPLANTATION ENERGY (KeV) | Si IMPLANTATION DOSE (cm$^{-2}$) | $N_S$ (cm$^{-2}$) | $\mu$ (cm$^2$/V-s) | $\eta$ (%) |
|---|---|---|---|---|---|---|---|
| A | NONE | NONE | 200 | $2 \times 10^{12}$ | $3.4 \times 10^{11}$ | 1650 | 34.1 |
| B | 750 | $5 \times 10^{12}$ | 200 | $2 \times 10^{12}$ | $1.4 \times 10^{12}$ | 4410 | 67.4 |
| C | 750 | $1 \times 10^{13}$ | 200 | $2 \times 10^{12}$ | $1.6 \times 10^{12}$ | 4320 | 78.0 |
| D | NONE | NONE | 180 | $5.2 \times 10^{12}$ | $4.0 \times 10^{12}$ | 3100 | 60.5 |
|   |      |      | 50  | $1.4 \times 10^{12}$ |                     |      |      |
| E | 750 | $5 \times 10^{12}$ | 180 | $5.2 \times 10^{12}$ | $4.7 \times 10^{12}$ | 4280 | 71.2 |
|   |      |      | 50  | $1.4 \times 10^{12}$ |                     |      |      |

Signed and Sealed this

Twenty-third Day of August 1983

[SEAL]

Attest:

GERALD J. MOSSINGHOFF

Attesting Officer    Commissioner of Patents and Trademarks